(12) United States Patent
Yuan et al.

(10) Patent No.: US 12,501,570 B2
(45) Date of Patent: Dec. 16, 2025

(54) BEARING BOX AND SPLICING DISPLAY APPARATUS

(71) Applicants: BOE MLED Technology Co., Ltd., Beijing (CN); BOE TECHNOLOGY GROUP CO., LTD., Beijing (CN)

(72) Inventors: Jiaxing Yuan, Beijing (CN); Shipeng Wang, Beijing (CN); Chao Tian, Beijing (CN); Jianbai Tan, Beijing (CN); Jianfeng Wang, Beijing (CN)

(73) Assignees: BOE MLED Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 146 days.

(21) Appl. No.: 18/292,409

(22) PCT Filed: Sep. 30, 2022

(86) PCT No.: PCT/CN2022/123137
§ 371 (c)(1),
(2) Date: Jan. 26, 2024

(87) PCT Pub. No.: WO2024/065635
PCT Pub. Date: Apr. 4, 2024

(65) Prior Publication Data
US 2025/0089194 A1   Mar. 13, 2025

(51) Int. Cl.
*H05K 5/13* (2025.01)
*G09F 9/302* (2006.01)
*H05K 5/02* (2006.01)

(52) U.S. Cl.
CPC ............. *H05K 5/13* (2025.01); *G09F 9/3026* (2013.01); *H05K 5/0208* (2013.01)

(58) Field of Classification Search
CPC ....................................................... H05K 5/13
See application file for complete search history.

(56) References Cited

U.S. PATENT DOCUMENTS

| | | | |
|---|---|---|---|
| 2019/0239364 A1* | 8/2019 | Heo | H05K 5/30 |
| 2021/0004192 A1 | 1/2021 | Kamllke | |
| 2021/0033240 A1* | 2/2021 | Choi | F16M 11/046 |

FOREIGN PATENT DOCUMENTS

| | | |
|---|---|---|
| CN | 204178650 U | 2/2015 |
| CN | 205722609 U | 11/2016 |
| CN | 109716423 A | 5/2019 |
| CN | 110675762 A | 1/2020 |

(Continued)

*Primary Examiner* — Jerry Wu
(74) *Attorney, Agent, or Firm* — HOUTTEMAN LAW LLC (57) ABSTRACT

The present disclosure provides a bearing box and a splicing display apparatus. The bearing box includes: a box body configured to bear a display assembly, where a fixing part is disposed on a side of the display assembly facing the box; an adjusting member on the box body, including: a magnetic part and an adjusting part connected to the magnetic part, where the magnetic part is configured to be connected to the fixing part, and the adjusting part is configured to be movable under an operation of the magnetic operating member along a thickness direction of the display assembly relative to the box body, to adjust a distance between the fixing part and the box body.

14 Claims, 11 Drawing Sheets

(56) References Cited

FOREIGN PATENT DOCUMENTS

| | | |
|---|---|---|
| CN | 210200203 U | 3/2020 |
| CN | 110992848 A | 4/2020 |
| CN | 210896367 U | 6/2020 |
| CN | 211878916 U | 11/2020 |
| CN | 211980084 U | 11/2020 |
| CN | 212302949 U | 1/2021 |
| CN | 212847513 U | 3/2021 |
| CN | 113374771 A | 9/2021 |
| CN | 215643475 U | 1/2022 |
| CN | 217008536 U | 7/2022 |
| JP | 2007216345 A | 8/2007 |
| WO | WO 2022260347 A1 | 12/2022 |

* cited by examiner

BEARING BOX AND SPLICING DISPLAY APPARATUS

TECHNICAL FIELD

The present disclosure relates to the field of display technology, and specifically relates to a bearing box and a splicing display apparatus.

BACKGROUND

Small size inorganic light-emitting diodes include Mini-LEDs and Micro-LEDs. The Mini-LED refers to a light-emitting diode (LED) chip with a grain size of about 100 to 300 microns.

The Micro-LED refers to an LED chip with a grain size of less than 100 microns. The Mini-LED/Micro-LED display apparatus has the advantages of low power consumption, high brightness, high resolution, high color saturation, fast response, long service life, high efficiency and the like. In addition, a plurality of Mini-LED/Micro-LED display apparatuses may be seamlessly spliced to obtain an oversized display product, which has promising application prospects in large-size display fields including command and monitoring centers, business centers, high-end conferences, cinemas and the like.

SUMMARY

The present disclosure provides a bearing box and a splicing display apparatus.

In a first aspect, the present disclosure provides a bearing box, including:
a box body configured to bear a display assembly, wherein a fixing part is disposed on a side of the display assembly facing the box;
an adjusting member on the box body, including: a magnetic part and an adjusting part connected to the magnetic part, wherein the magnetic part is configured to be connected to the fixing part, and the adjusting part is configured to be movable under an operation of the magnetic operating member along a thickness direction of the display assembly relative to the box body, to adjust a distance between the fixing part and the box body.

In some embodiments, the adjusting part includes a threaded rod, the box body is provided with a threaded hole matched with the threaded rod, and at least a portion of the threaded rod is disposed into the threaded hole.

In some embodiments, the magnetic part includes: a mount and a magnetic member, the magnetic member is fixed to the mount, and the mount is connected to the adjusting part.

In some embodiments, the mount and the adjusting part form an integral structure.

In some embodiments, the mount is provided with a mounting slot, and the magnetic member is fixed in the mounting slot.

In some embodiments, a notch in communication with the mounting slot is provided on an end of the mount facing the display substrate.

In some embodiments, the magnetic part includes one magnetic member, and an extension line of an axis of the adjusting part passes through the magnetic member.

In some embodiments, the magnetic part includes a plurality of magnetic members uniformly distributed around an extension line of an axis of the adjusting part.

In some embodiments, an orthographic projection of the magnetic member on the mount has a strip-like shape;
or, the orthographic projection of the magnetic member on the mount is a pattern formed by at least two strip-like parts intersected with each other.

In some embodiments, the box comprises: a bottom wall and a sidewall connected to the bottom wall, wherein the bottom wall and the sidewall define an accommodation space, wherein the bottom wall is further provided with at least one support platform, wherein the support platform has a first surface connected to the bottom wall, a second surface facing the display substrate, and a side surface connected between the first surface and the second surface, wherein the support platform is located in the accommodation space, and the threaded hole is provided in the second surface of the support platform.

In some embodiments, the box body has one or more bearing regions, each of which corresponds to one display assembly and is provided with the adjusting member at each corner position.

In a second aspect, the present disclosure provides a splicing display apparatus, including: a display assembly and a bearing box bearing the display assembly, wherein the bearing box is the bearing box as described above.

In some embodiments, the fixing part is made of a material including a ferromagnetic material.

In some embodiments, the fixing part includes an iron block and an anti-oxidation layer covering at least partially a surface of the iron block.

In some embodiments, the display assembly includes: a display substrate including: a printed circuit board and a light-emitting element on the printed circuit board, the light-emitting element is located on a side of the printed circuit board away from the bearing box, and the fixing part is fixed to a side of the printed circuit board facing the bearing box.

In some embodiments, the display assembly includes:
a display substrate including: a base substrate and a light-emitting element on the base substrate, the light-emitting element being located on a side of the base substrate away from the bearing box; and
a bracket between the display substrate and the bearing box;
wherein the base substrate is fixedly connected to the bracket, and the fixing part is fixed to a side of the bracket facing the bearing box.

BRIEF DESCRIPTION OF DRAWINGS

Accompanying drawings are provided for further understanding of the present disclosure and constitute a part of the specification. Hereinafter, these drawings are intended to explain the present disclosure together with the following specific implementations, but should not be considered as a limitation of the present disclosure, in which.

DETAIL DESCRIPTION OF EMBODIMENTS

Hereinafter, specific implementations of the present disclosure will be described with respect to the accompanying drawings. It will be appreciated that the specific implementations as set forth herein are merely for the purpose of illustration and explanation of the present disclosure and should not be constructed as a limitation thereof.

To make the objects, technical solutions and advantages of the embodiments of the present disclosure more apparent, the technical solutions according to the embodiments of the present disclosure will be clearly and completely described below with reference to the drawings of the embodiments of the present disclosure. Apparently, the described embodiments are some, but not all, of the embodiments of the present disclosure. All other embodiments obtained by those of ordinary skill in the art based on the embodiments of the present disclosure described herein without paying any creative effort shall be included in the protection scope of the present disclosure.

The terminology used herein to describe embodiments of the disclosure is not intended to limit and/or define the scope of the present disclosure. For example, unless otherwise defined, technical or scientific terms used in the present disclosure are intended to have general meanings as understood by those of ordinary skill in the art. It will be appreciated that the words "first", "second" and similar terms used in the present disclosure do not denote any order, quantity, or importance, but are used merely for distinguishing different components from each other. The singular forms "a," "an," or "the" and similar referents do not denote a limitation of quantity, but rather denote the presence of at least one, unless the context clearly dictates otherwise. The word "comprise" or "include", and the like, means that the element or item appearing in front of the word "comprise" or "include" includes the element or item listed after the word "comprise" or "include" and equivalents thereof, and does not exclude other elements or items. The terms "connected" or "coupled" and the like are not restricted to physical or mechanical connections, but may include electrical connections, whether direct or indirect. The words "upper", "lower", "left", "right", or the like are merely used to indicate a relative positional relationship, and when an absolute position of the described object is changed, the relative positional relationship may also be changed accordingly.

In the splicing display apparatus, a bearing box is configured to bear at least one display assembly. In one example, the display assembly may include: a bracket and a display substrate born on the bracket. The bracket is fixed to the bearing box, while the display substrate is fixed to a side of the bracket away from the bearing box. The display substrate may include a base substrate and a light-emitting element on the base substrate. The base substrate may be a glass substrate, and the light-emitting element may include a small size inorganic light-emitting diode. In another example, the display assembly may also include a display substrate including: a printed circuit board and a light-emitting element on the printed circuit board, and the light-emitting element may include a small size inorganic light-emitting diode. In this case, the display substrate may be directly fixed to the bearing box.

Further, in the splicing display apparatus, a plurality of display substrates may be provided and spliced with each other to implement splicing display. For example, in the splicing display apparatus, one bearing box bearing a plurality of display substrates is provided. For another example, a plurality of bearing boxes each bearing one or more display substrates are provided.

In the assembly process of the splicing display apparatus, after the display assembly is fixed to the bearing box, the condition that display surfaces of a plurality of display substrates are not in the same plane may easily occur due to limitations of the production process, and in this case, the display assembly has to be adjusted in a thickness direction of the display substrates until the display surfaces of the plurality of display substrates are in the same plane.

Figure 1:
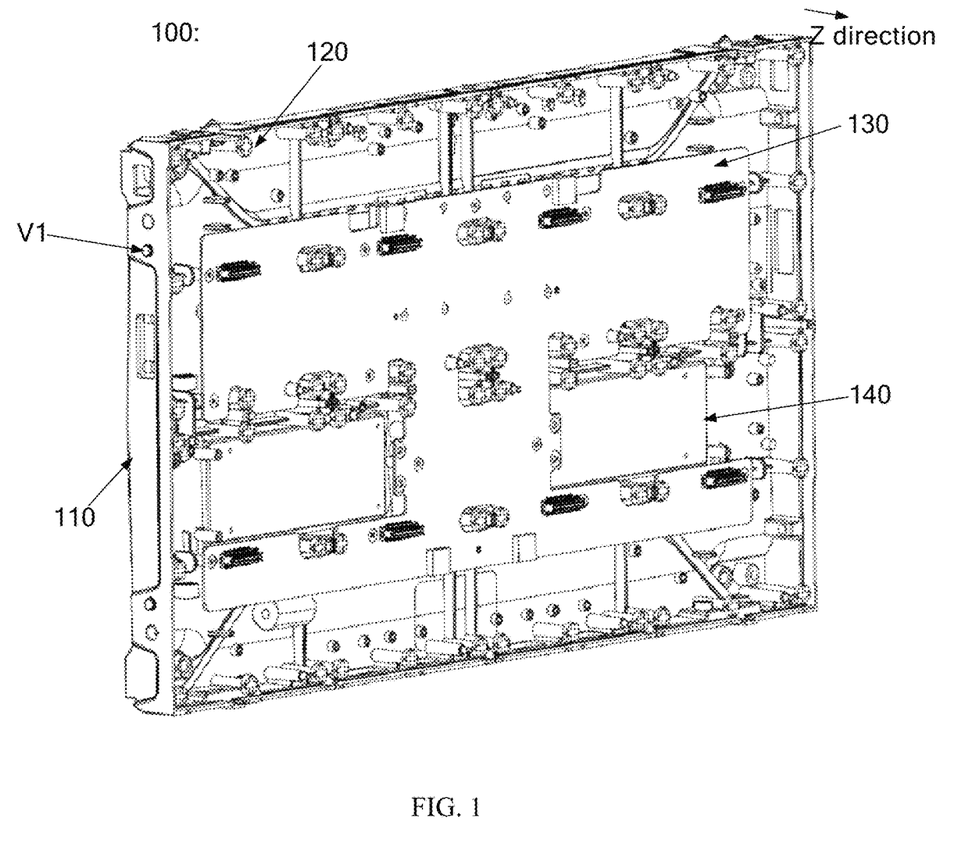
FIG. 1 is a schematic diagram of a bearing box according to some embodiments of the present disclosure.
Figure 2:
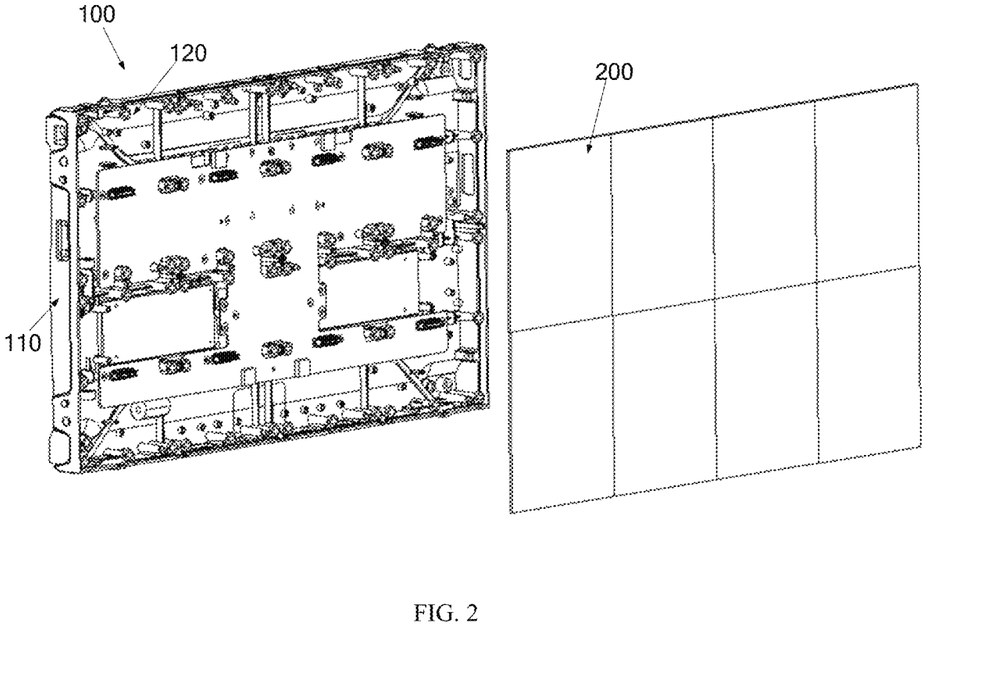
FIG. 2 is a schematic diagram of a bearing box according to some embodiments of the present disclosure before assembly with a display assembly.
Figure 3:
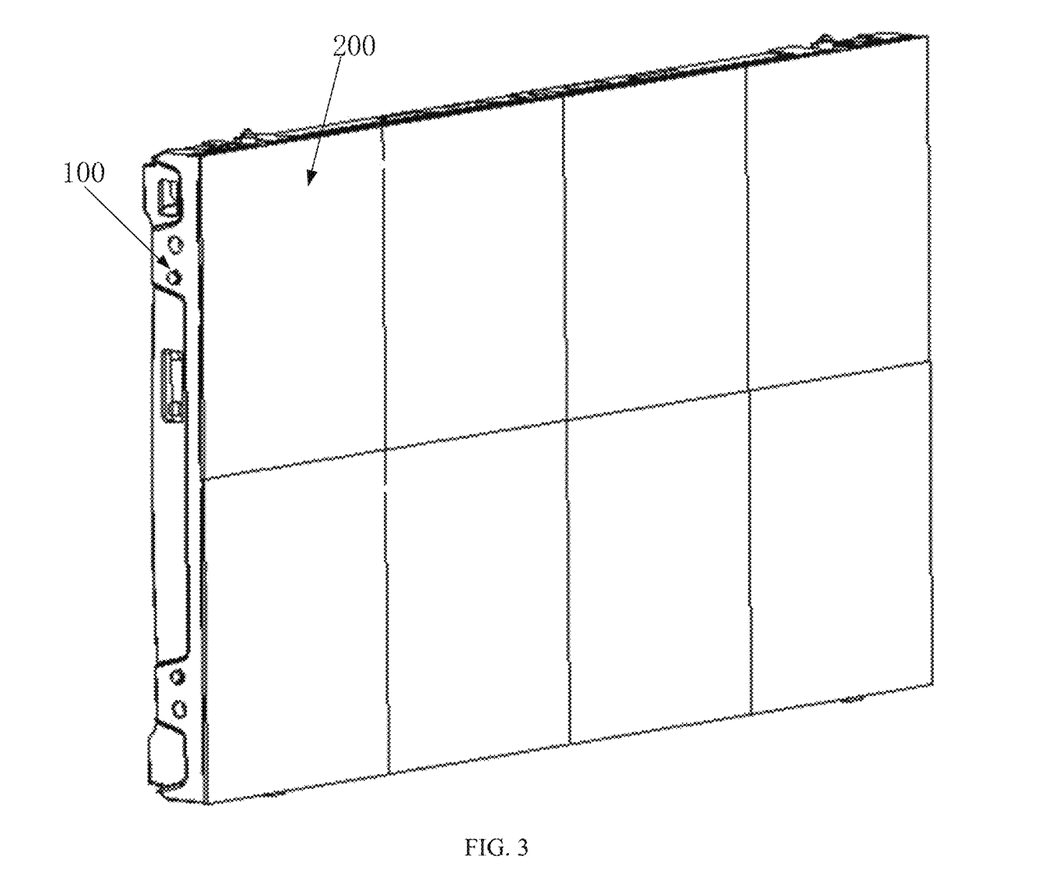
FIG. 3 is a schematic diagram of a splicing display apparatus according to some embodiments of the present disclosure.
Figure 4:
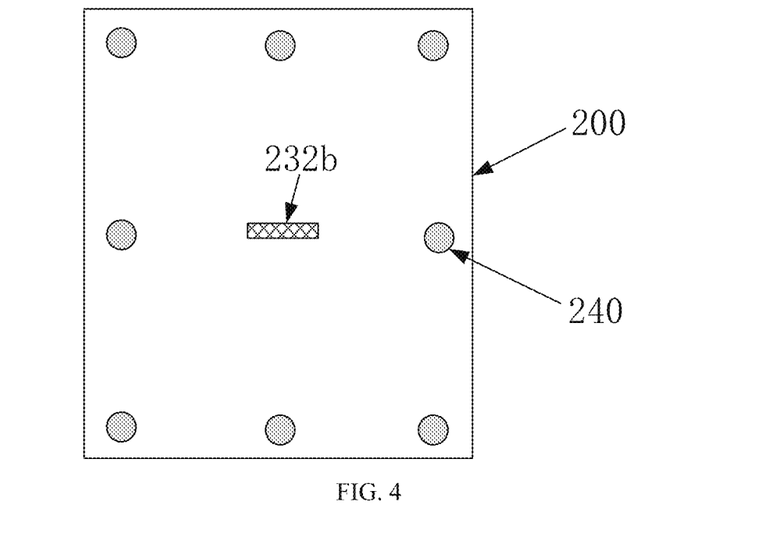
FIG. 4 is a rear view of a display assembly according to some embodiments of the present disclosure.
Figure 5:
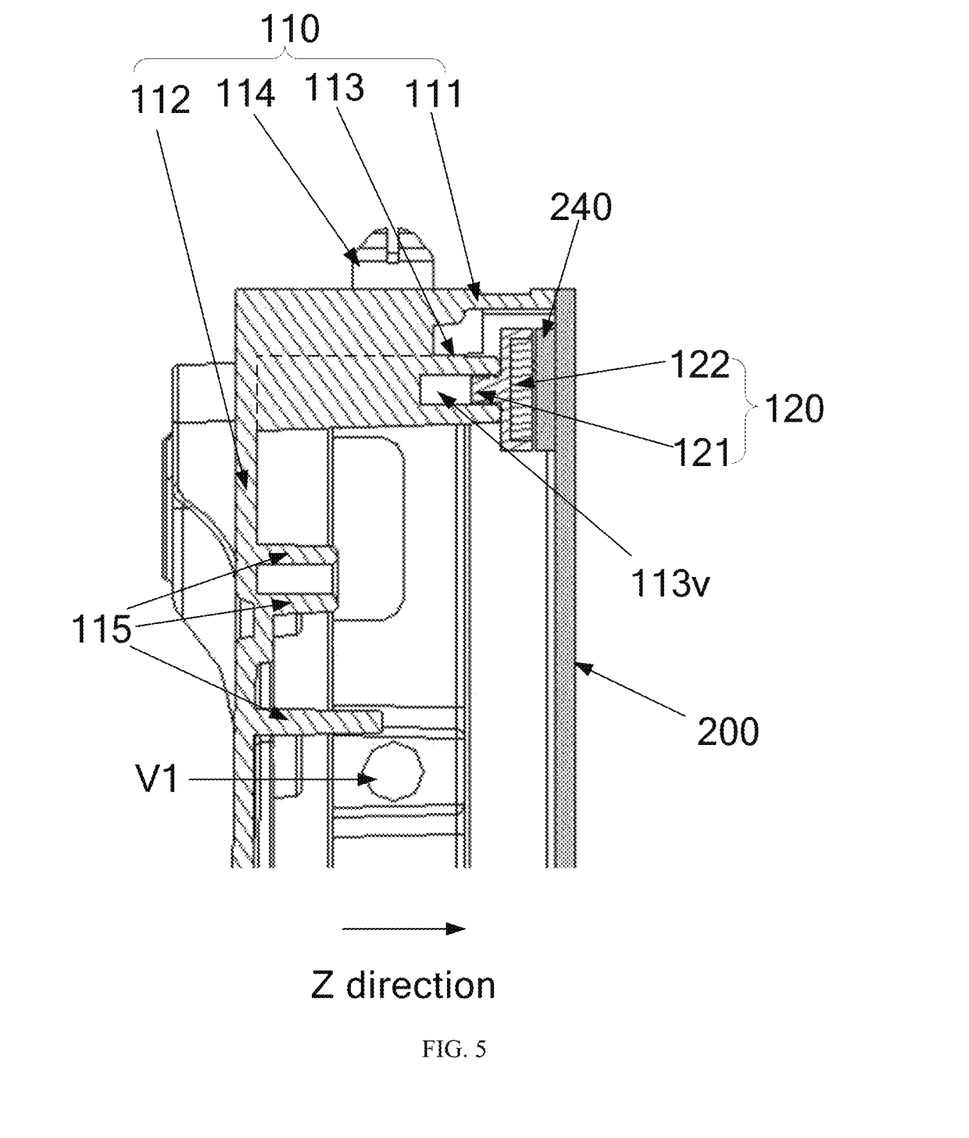
FIG. 5 is a partial sectional view of a splicing display apparatus according to an embodiment of the present disclosure.

FIG. 1 is a schematic diagram of a bearing box according to some embodiments of the present disclosure. FIG. 2 is a schematic diagram of a bearing box according to some embodiments of the present disclosure before assembly with a display assembly. FIG. 3 is a schematic diagram of a splicing display apparatus according to some embodiments of the present disclosure. FIG. 4 is a rear view of a display assembly according to some embodiments of the present disclosure. FIG. 5 is a partial sectional view of a splicing display apparatus according to an embodiment of the present disclosure. As shown in FIGS. 1 to 5, the bearing box 100 includes: a box body 110 and an adjusting member 120 on the box body 110.

The box body 110 is configured to bear at least one display assembly 200. The display assembly 200 may include at least one display substrate. FIG. 2 takes the box body 110 bearing eight display assemblies 200 as an example for illustration, but other numbers of display assemblies 200 may be provided in other examples. For example, the box body 110 may bear one display assembly 200 including one display substrate, and a plurality of box bodies 110 are spliced to jointly bear a plurality of display substrates, thereby implementing splicing display. For another example, the box body 110 may bear a plurality of display assembly 200 each including one or more display substrates.

As shown in FIGS. 4 and 5, a fixing part 240 is disposed on a side of the display assembly 200 facing the box body 110, and the fixing part 240 is configured to be connected to the adjusting member 120.

Figure 6:
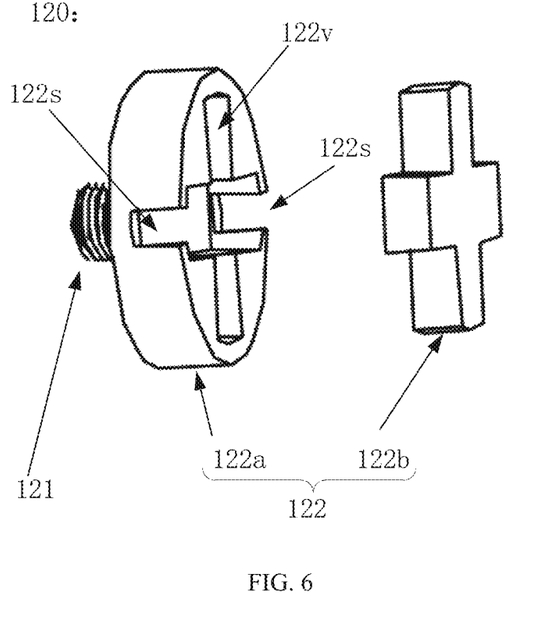
FIG. 6 is an exploded schematic view of an adjusting member according to some embodiments of the present disclosure.

FIG. 6 is an exploded schematic view of an adjusting member according to some embodiments of the present disclosure. As shown in FIG. 6, the adjusting member 120 includes: a magnetic part 122 and an adjusting part 121 connected to the magnetic part 122. The magnetic part 122 is configured to be connected to the fixing part 240, and the adjusting part 121 is configured to be movable under an operation of the magnetic operating member along a Z direction (thickness direction of the display substrate) relative to the box body 110, to adjust a distance between the fixing part 240 and the box body 110.

It should be noted that the term "magnetic operating member" does not necessarily mean that the operating member is entirely magnetic, and it is sufficient that a part of the operating member is magnetic to drive the adjusting member 120 to move in the Z direction relative to the box body 110.

In an embodiment of the present disclosure, the adjusting member 120 can be moved under an operation of the magnetic operating member along the Z direction relative to the box body 110, so as to drive a corresponding position of the display assembly 200 to move along the Z direction relative to the bearing box 100, and further, to adjust a distance from each position on a display surface of the display substrate to a reference plane until the display surfaces of all display substrates are in the same plane. Moreover, the magnetic part 122 in the adjusting member 120 is connected to the fixing part 240, so that even if the magnetic part 122 and the magnetic operating member 300 are spaced apart by the display assembly 200, the adjusting member 120 can be driven to move through a magnetic force between the magnetic operating member and the magnetic part 122 without separating the display assembly 200 from the bearing box 100, thereby preventing collision with the display assembly 200, during the separation, and, in the adjusting process, an operator can judge whether the adjustment result meets the requirement more intuitively, which is favorable to improving the adjustment efficiency.

Figure 7:
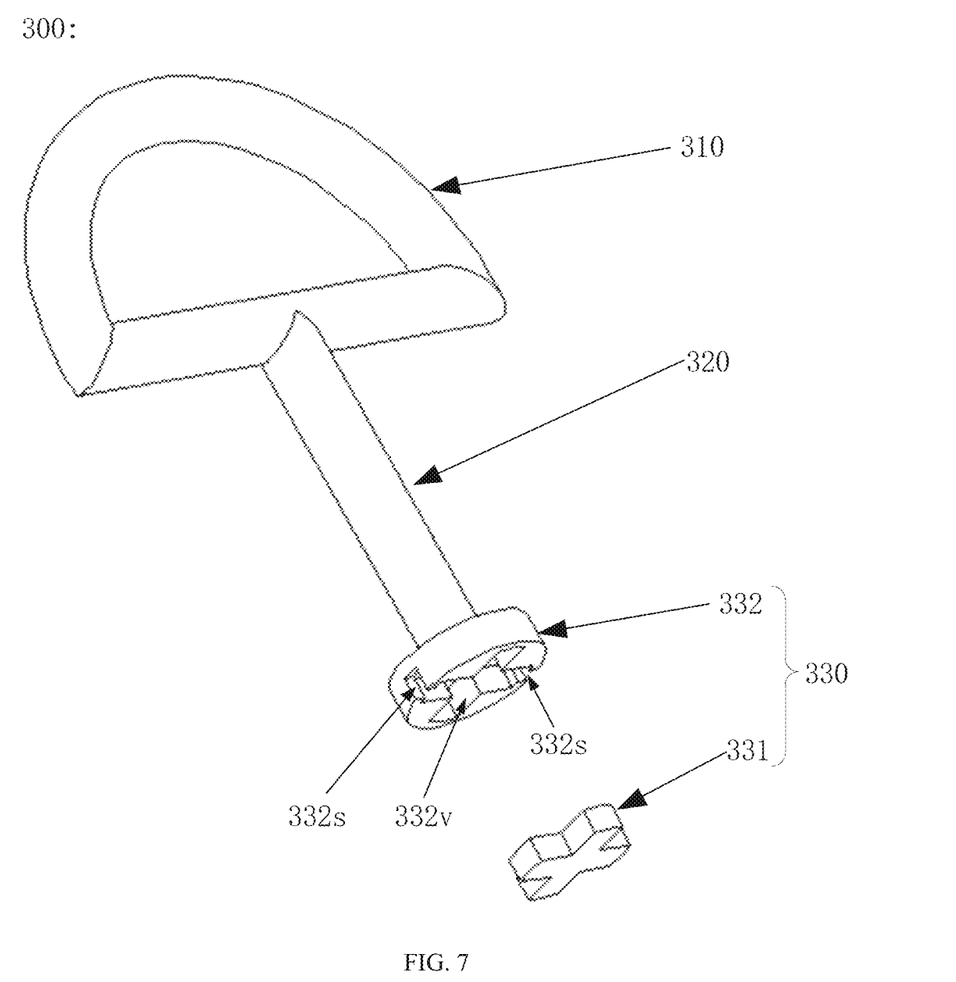
FIG. 7 is a schematic diagram of a magnetic operating member according to some embodiments of the present disclosure.
Figure 8A:
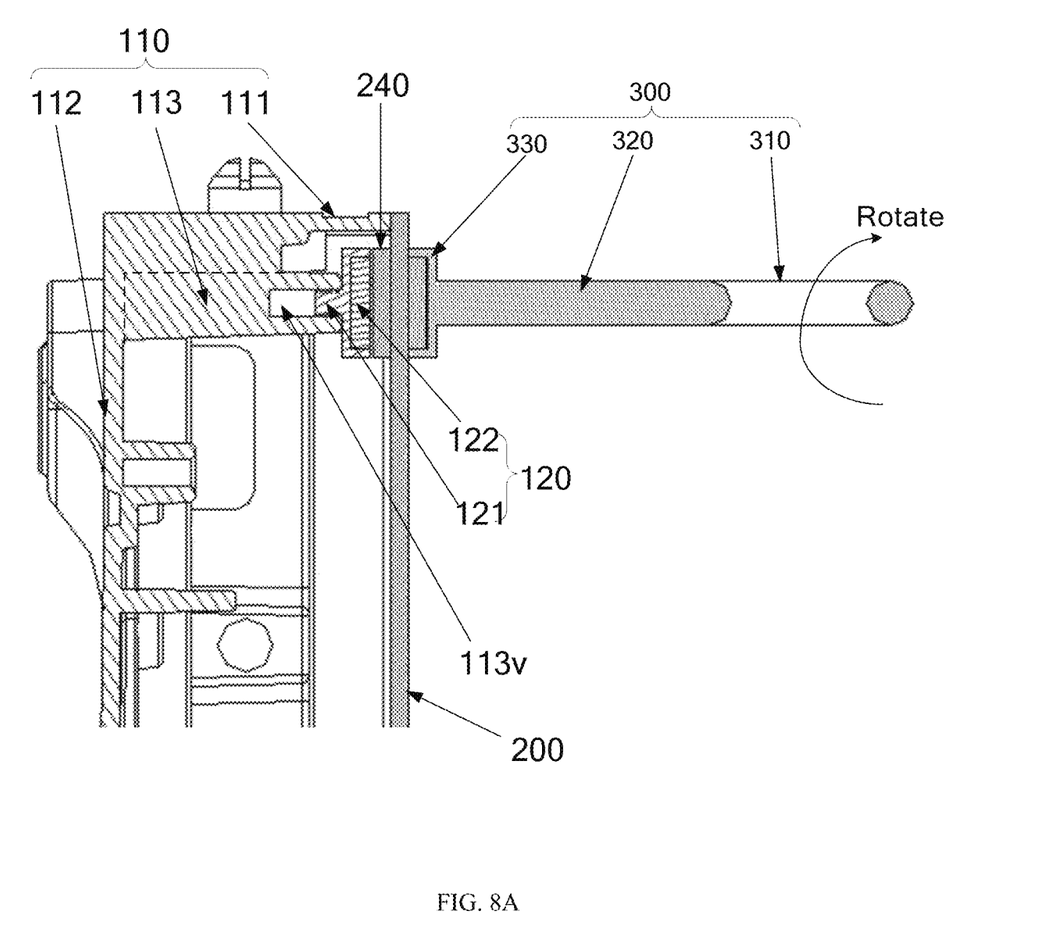
FIG. 8A is a schematic diagram showing a magnetic operating member controlling movement of an adjusting member according to some embodiments of the present disclosure.
Figure 8B:
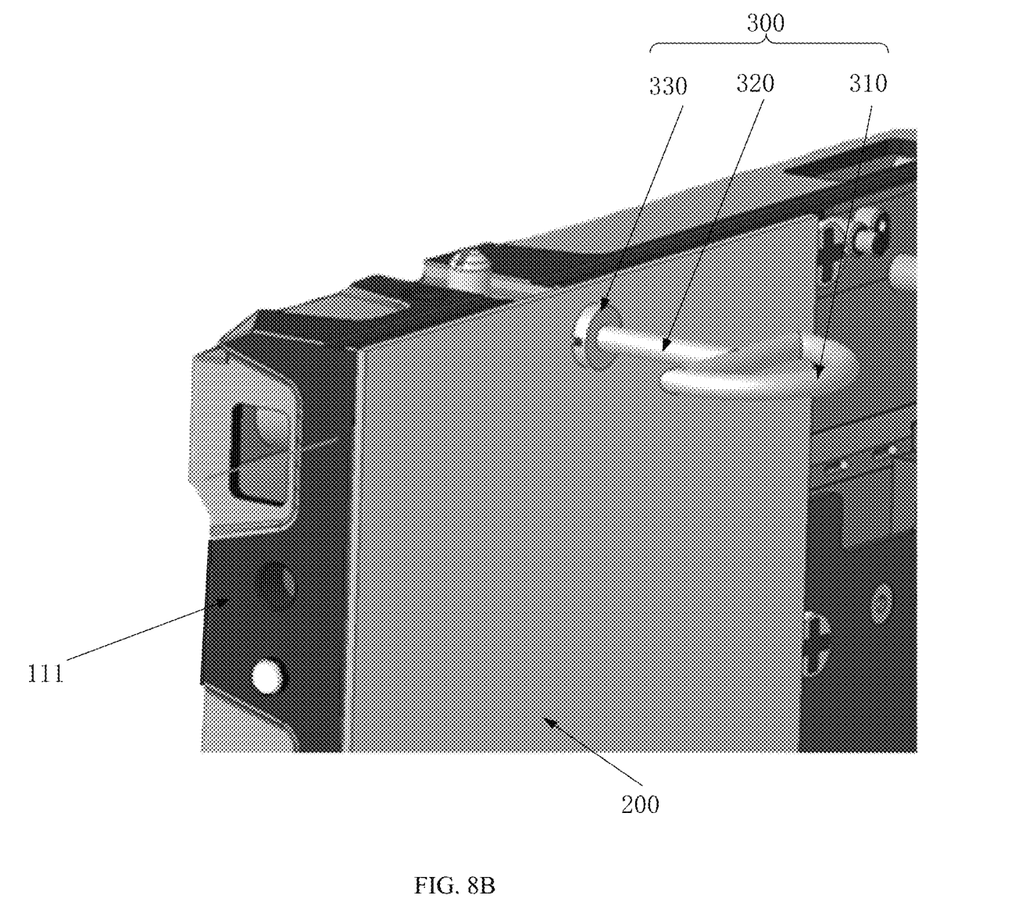
FIG. 8B is a partial perspective view showing a magnetic operating member controlling movement of an adjusting member according to some embodiments of the present disclosure.
Figure 8C:
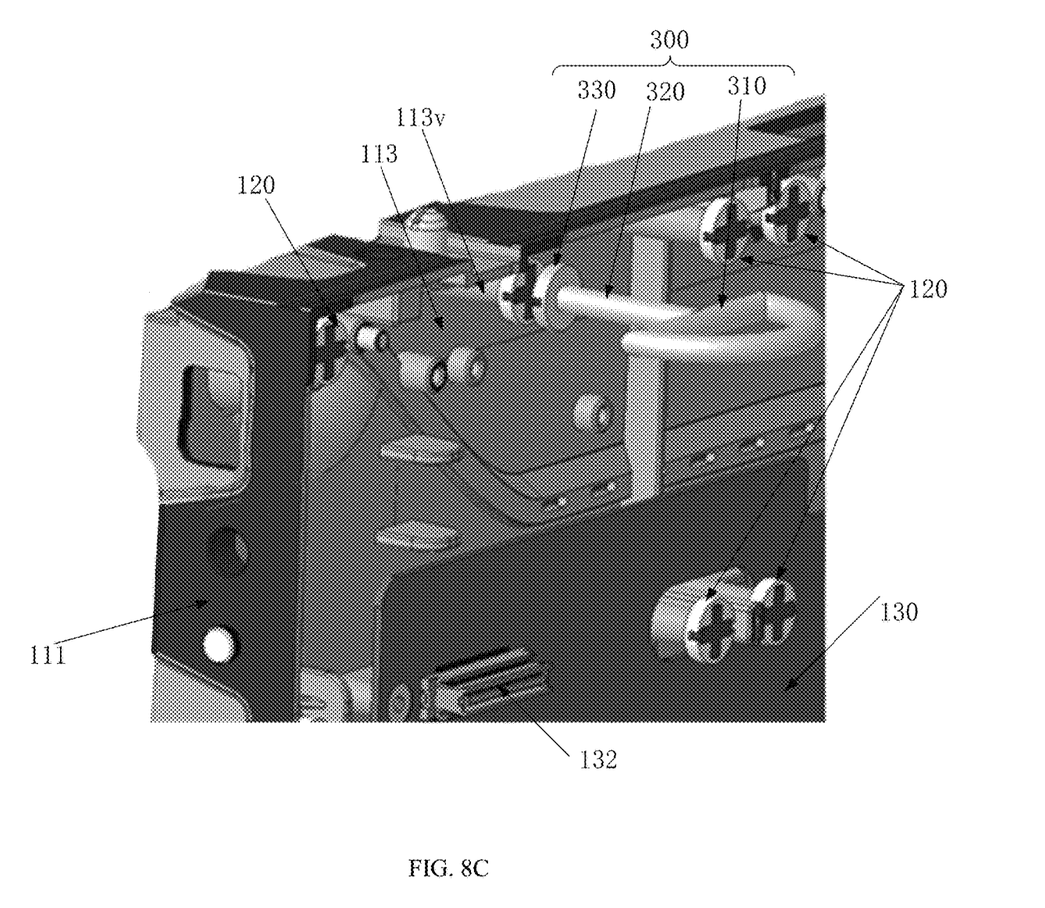
FIG. 8C is another partial perspective view showing a magnetic operating member controlling movement of an adjusting member according to some embodiments of the present disclosure.

FIG. 7 is a schematic diagram of a magnetic operating member according to some embodiments of the present disclosure. FIG. 8A is a schematic diagram showing a magnetic operating member controlling movement of an adjusting member according to some embodiments of the present disclosure. FIG. 8B is a partial perspective view showing a magnetic operating member controlling movement of an adjusting member according to some embodiments of the present disclosure. FIG. 8C is another partial perspective view showing a magnetic operating member controlling movement of an adjusting member according to some embodiments of the present disclosure. To show a positional relationship of the magnetic operating member 300 and the adjusting member 120 more clearly, the display assembly 200 is omitted in FIG. 8C. As shown in FIGS. 7 to 8C, the magnetic operating member 300 includes: a grip part 310, a connection part 320 and an operating head part 330. One end of the connection part 320 is connected to the grip part 310, and the other end of the connection part 320 is connected to the operating head part 330. The connection part 320 may be formed as an integral structure with the grip part 310 to improve structural stability. Apparently, the connection part 320 may be fixedly connected to the grip part 310 by other connecting means, for example, by fasteners such as screws.

Two ends of the operating head part 330 and the magnetic part 122 close to each other may have opposite polarities (i.e., may be set to N pole and S pole, respectively), so that the two ends are attracted to each other when getting closer.

In some embodiments, the operating head part 330 may include a fixing seat 332 and a first magnetic member 331 fixed into the fixing seat 332. For example, the fixing seat 332 is provided with a fixing slot 332v, and the first magnetic member 331 is fixed into the fixing slot 332v. The first magnetic member 331 may be a permanent magnet with an axial magnetization direction. Exemplarily, a main body of the first magnetic member 331 may be made of neodymium iron boron strong magnet, and the first magnetic member 331 may be surface treated by nickel copper nickel.

In some embodiments, the first magnetic member 331 has a shape matched with the fixing slot 332v. For example, an orthographic projection of the first magnetic member 331 on the fixing seat, and a cross section of the fixing slot 332v, may both have a circular, square, straight, cross, or asterisk shape or the like, and a thickness of the first magnetic member 331 may be the same as, or similar to, a depth of the fixing slot 332v.

The first magnetic member 331 may be embedded into the fixing slot 332v, or an adhesive may be provided in the fixing slot 332v, to further improve the stability of the first magnetic member 331 in the fixing slot 332v.

In some embodiments, a first notch 332s, in communication with the fixing slot 332v, is provided on an end of the fixing seat 332 away from the grip part 310. A plurality of first notches 332s, for example, two opposite first notches 332s, may be provided. Apparently, three, four or more first notches 332s may be provided. In the product maintenance process, if the first magnetic member 331 is to be taken out of the fixing seat 332, a jig may be inserted into the first notch 332s to clamp and remove the first magnetic member 331. In one example, the fixing seat 332 is threadedly connected to the connection part 320. In this case, when the fixing seat 332 is connected to the connection part 320, a tool may be inserted into the first notch 332s to drive the fixing seat 332 to rotate relative to the connection part 320, so that threads on the fixing seat 332 are engaged with threads on the connection part 320. Apparently, the fixing seat 332 and the connection part 320 may be connected in a non-detachable manner, such as welding, or the fixing seat 332 and the connection part 320 are formed as an integral structure.

Apparently, in other embodiments, the fixing seat 332 may be omitted, and instead, the connection part 320 is directly and fixedly connected to the first magnetic member 331. For example, the first magnetic member 331 is threadedly connected to the connection part 320.

In the embodiments of the present disclosure, the shape of the grip part 310 is not limited. For example, as shown in FIG. 7, the grip part 310 may include an arched part and a straight part, two ends of the arched part are connected to two ends of the straight part, respectively, and a middle portion of the straight part is connected to the connection part 320. Apparently, the grip part 310 may have other shapes. For example, the grip part 310 has an annular shape.

In some embodiments, as shown in FIGS. 6 and 8A, the adjusting part 121 includes a threaded rod. The box body 110 is provided with a threaded hole 113v matched with the threaded rod. At least a portion of the threaded rod is disposed into the threaded hole 113v.

When the adjusting member 120 is controlled to move by the magnetic operating member 300, as shown in FIGS. 8A to 8C, the operating head part 330 of the magnetic operating member 300 is disposed opposite to the adjusting member 120, and as described above, the operating head part 330 of the magnetic operating member 300 has an opposite polarity to the magnetic part 122, so that the operating head part 330 and the magnetic part 122 are attracted with each other. In this case, the magnetic operating member 300 can be rotated to drive the adjusting member 120 to rotate synchronously, so that the adjusting member 120 is moved in the Z direction relative to the box body 110.

In some embodiments, as shown in FIG. 6, the magnetic part 122 includes: a mount 122a and a second magnetic member 122b. The second magnetic member 122b is fixed to the mount 122a, and the mount 122a is connected to the adjusting part 121. For example, the mount 122a and the adjusting part 121 form an integral structure, so that the mount 122a remains fixedly connected to the adjusting part 121 throughout the rotation of the adjusting member 120.

In some embodiments, as shown in FIG. 6, the mount 122a is provided with a mounting slot 122v. The second magnetic member 122b is fixed in the mounting slot 122v. The second magnetic member 122b may be a permanent magnet with an axial magnetization direction. Exemplarily, a main body of the second magnetic member 122b may be made of neodymium iron boron strong magnet, and the second magnetic member 122b may be surface treated by nickel copper nickel. When the first magnetic member 331 and the second magnetic member 122b are both made of a strong magnetic material, a strong magnetic force can be generated between the operating head part 330 and the magnetic part 122, thereby ensuring synchronous rotation of the adjusting member 120 with the magnetic operating member 300.

In some embodiments, the second magnetic member 122b has a shape matched with the mounting slot 122v. For example, an orthographic projection of the second magnetic member 122b on the mount 122a, and a cross section of the mounting slot 122v, may both have a circular, square, straight, cross, or asterisk shape or the like, and a thickness of the second magnetic member 122b may be the same as, or similar to, a depth of the mounting slot 122v. The orthographic projection of the second magnetic member 122b on the mount 122a having a straight shape means that the orthographic projection of the second magnetic member 122b on the mount 122a has a strip shape, i.e., a rounded rectangle or right-angled rectangle shape. The orthographic projection of the second magnetic member 122b on the mount 122a having a cross shape means that the orthographic projection of the second magnetic member 122b on the mount 122a is a pattern formed by two strip-like parts intersected with each other. Apparently, the orthographic projection of the second magnetic member 122b on the mount 122a may be a pattern formed by more strip-like parts intersected with each other, such as an asterisk shape.

In addition, in practical applications, the second magnetic member 122b may have the same shape as the first magnetic member 331, so that a stable magnetic field is generated between the first magnetic member 331 and the second magnetic member 122b. In one example, the orthographic projection of the first magnetic member 331 on the fixing seat 332, and the orthographic projection of the second magnetic member 122b on the mount 122a, both have a cross shape.

The second magnetic member 122b may be embedded into the mounting slot 122v, or an adhesive may be provided in the mounting slot 122v, to further improve the stability of the second magnetic member 122b in the mounting slot 122v.

In some embodiments, as shown in FIG. 6, a second notch 122s, in communication with the mounting slot 122v, is provided on an end of the mount 122a facing the display substrate. A plurality of second notches 122s, for example, two opposite second notches 122s, may be provided. Apparently, three, four or more second notches 122s may be provided. In the product maintenance process, to take the second magnetic member 122b out of the mount 122a, a chuck of a jig may be inserted into the second notch 122s to clamp and remove the second magnetic member 122b.

In some embodiments, as shown in FIG. 6, the magnetic part 122 includes one second magnetic member 122b, and in this case, an extension line of an axis of the adjusting part 121 passes through the second magnetic member 122b to control overall rotation of the adjusting member 120. For example, a central axis of the second magnetic member 122b and the axis of the adjusting part 121 are located on the same straight line.

It should be noted that FIG. 6 takes the magnetic part 122 including one second magnetic member 122b as an example for illustration. In other embodiments, the magnetic part 122 may include a plurality of second magnetic members 122b which may have the same polarity. The mount 122a may be provided with a plurality of mounting slots 122v, and the second magnetic members 122b are disposed in the mounting slots 122v in one-to-one correspondence. For example, the number of the second magnetic members 122b and the number of the mounting slots 122v are both three, or four, or any other number. The plurality of second magnetic members 122b may have the same size and shape. In addition, the plurality of second magnetic members 122b are uniformly distributed around the extension line of the axis of the adjusting part 121, so that when the adjusting member 120 is driven to rotate by an external magnetic operating member 300, the stress on each second magnetic member 122b is substantially the same, and thus the adjusting member 120 can rotate smoothly.

In the case where the magnetic part 122 includes a plurality of second magnetic members 122b, when the adjusting member 120 is driven to rotate by an external magnetic operating member 300, the rotational torque is greater, and the operation is more convenient.

In addition, when the magnetic part 122 includes a plurality of second magnetic members 122b, and correspondingly, the magnetic operating member 300 includes a plurality of first magnetic members 331. The plurality of first magnetic members 331 have the same polarity, which is opposite to a polarity of the plurality of second magnetic members 122b. The number and distribution of the first magnetic members 331 may be the same as those of the second magnetic members 122b. That is, the plurality of first magnetic members 331 are uniformly distributed around an extension line of the axis of the connection part 320. When the adjusting member 120 is driven to rotate by the magnetic operating member 300, the second magnetic members 122b and the first magnetic members 331 are attracted in a one-to-one correspondence.

In some embodiments, as shown in FIG. 5, the box body 110 includes: a bottom wall 112 and a sidewall 111 connected to the bottom wall 112. The bottom wall 112 and the sidewall 111 define an accommodation space, and the bottom wall 112 may be further provided with at least one support platform 113 in the accommodation space. The support platform 113 has a first surface connected to the bottom wall 112, a second surface facing the display assembly 200, and a side surface connected between the first surface and the second surface. A part of a sidewall of the support platform 113 is abutted against the sidewall 111 of the box body 110. In one example, the support platform 113 and the sidewall 111 may form an integral structure. The threaded hole 113v is provided in the second surface of the support platform 113.

In some embodiments, as shown in FIG. 5, a plurality of reinforcing ribs 115 may be further provided on the bottom wall 112 of the box body 110 to improve stability of the bottom wall 112. The shape and size of the reinforcing rib 115 may be flexibly set according to actual needs.

In some embodiments, as shown in FIGS. 1 and 5, a positioning member 114 may be further disposed on the sidewall 111 of the box body 110. The positioning member 114 is configured to position with an adjacent box body 110. For example, for two adjacent box bodies 110 of a splicing display apparatus, each box body 110 is provided with a positioning member 114 on the sidewall, where the positioning member 114 on one box body 110 may be a positioning post, while the positioning member 114 on the other box body 110 may be a positioning groove. Apparently, the positioning members 114 on two adjacent box bodies 110 may also implement positioning in other forms.

Figure 9:
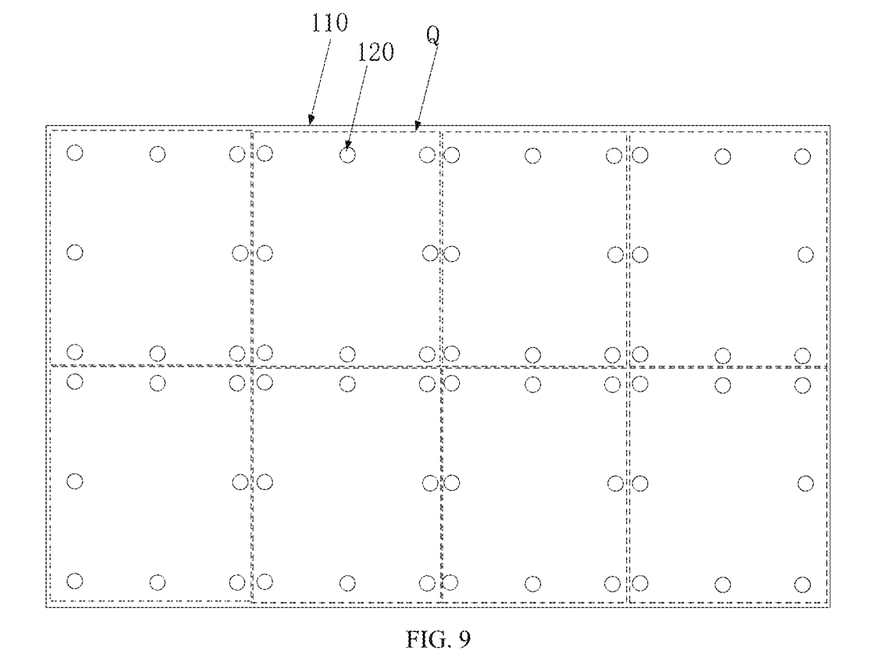
FIG. 9 is a schematic diagram showing distribution of adjusting members on a box body according to some embodiments of the present disclosure.

FIG. 9 is a schematic diagram showing distribution of adjusting members on a box body according to some embodiments of the present disclosure. As shown in FIG. 9, in some embodiments, the box body 110 has at least one or more bearing regions Q each corresponding to one display assembly 200. FIG. 9 takes eight bearing regions Q as an example for illustration, but in practical production applications, other numbers of bearing regions Q may be provided. Exemplarily, the display assembly 200 has a rectangular structure, and accordingly, the bearing region Q is a rectangular region. For each bearing region Q, the adjusting member 120 is provided at each corner position of the bearing region Q, so as to facilitate adjustment of the distance between each position on the display surface of the display assembly 200 and the reference plane. Apparently, the adjusting member may also be provided at other positions of the bearing region Q. For example, one or more adjusting members 120 may be provided at a position close to an edge of the bearing region Q and between two corners. On the same side edge of the bearing region Q, a distance between two adjacent adjusting members 120 may be ¼ to ⅓, ⅓ to ½, or ½ to ⅚ of a length of the side edge.

In some embodiments, the bearing box 100 further includes: a main control circuit board, a receiving circuit board, and a power module fixed to the box body 110. The main control circuit board 130, the receiving circuit board (not shown), and the power module 140 may be all disposed in a receiving part. For example, the main control circuit board 130, the receiving circuit board, and the power module 140 may be each fixed to the box body 110 by an adhesive member or a screw or the like. In addition, none of orthographic projections of the main control circuit board 130, the receiving circuit board and the power module 140 on the bottom wall 112 of the box body 110 is overlapped with the orthographic projection of the adjusting member 120 on the bottom wall 112. The receiving circuit board is configured to receive a video source signal and output a display drive signal to the main control circuit board 130 according to the video source signal. The video source signal is a signal corresponding to the display content of the splicing display apparatus. According to a voltage source signal (e.g., a 220V voltage signal), the power module 140 is configured to perform voltage conversion on the voltage source signal, and the power module 140 is configured to provide a target electrical signal for the main control circuit board 130 according to the converted voltage. The target electrical signal is an electrical signal required by normal operation of the main control circuit board 130. The main control circuit board 130 is electrically connected to the display assembly 200, and the main control circuit board 130 is configured to provide a control signal for the display assembly 200 according to the display drive signal and the target electrical signal, so as to control the display assembly 200 to display.

The voltage source signal and the video source signal may be provided for the receiving circuit board and the power module 140 through transmission lines, respectively. Accordingly, as shown in FIGS. 1 and 5, a through hole V1 is provided in the sidewall of the box body 110, and transmission lines may pass through the through hole V1, to provide signals for the receiving circuit board and the power module 140.

An embodiment of the present disclosure further provides a splicing display apparatus, and as shown in FIGS. 3 and 5, the splicing display apparatus includes: a display assembly 200 and a bearing box 100 bearing the display assembly 200, where the bearing box 100 is the bearing box 100 according to any one of the above embodiments.

A fixing part 240 is disposed on a side of the display assembly 200 facing the box body 110, and a magnetic part 122 is connected to the fixing part 240.

In some embodiments, as described above, the adjusting part 121 of the adjusting member 120 includes a threaded rod matched with the threaded hole 113v, so that movement of the adjusting member 120 in the Z direction can be implemented by rotating the threaded rod. In this case, the fixing part 240 is made of a material including a ferromagnetic material. It should be noted that the ferromagnetic material refers to a material that can be attracted to a magnet. Therefore, the fixing part 240 is connected to the magnetic part 122 by magnetic attraction. For example, the fixing part 240 includes an iron block. It will be appreciated that when a certain adjusting member 120 is driven to rotate by the magnetic operating member 300, since other adjusting members 120 still remain attracted with the magnetic part 122, rotation of that adjusting member 120 can only drive the display assembly 200 to move, rather than rotate, in the Z direction.

In the embodiments of the present disclosure, the shape of the fixing part 240 is not limited. For example, the fixing part 240 may have a circular plate structure or a rectangular plate structure, or may have the same shape as the second magnetic member 122b. In some embodiments, an orthographic projection of the fixing part 240 on the display assembly 200 covers an orthographic projection of the second magnetic member 122b on the display assembly 200, so that in the product assembly process, stable attraction of the fixing part 240 and the second magnetic member 122b can be ensured even with an alignment deviation. For example, as shown in FIGS. 4 and 5, the fixing part 240 may have a circular plate structure, and a thickness of the fixing part 240 may be ¼ to 2 times of a thickness of the second magnetic member 122b. For example, the thickness of the fixing part 240 is ¼, or ½, or 1 time of the thickness of the second magnetic member 122b.

To prevent oxidation of the iron block in use of the splicing display apparatus, in some embodiments, in addition to the iron block, the fixing part 240 further includes an anti-oxidation layer covering at least partially a surface of the iron block. For example, the iron block includes a connection surface in contact with the display assembly, and a portion of the surface of the iron block other than the connection surface is covered with the anti-oxidation layer. The anti-oxidation layer is, for example, a nickel plating layer.

Figure 10:
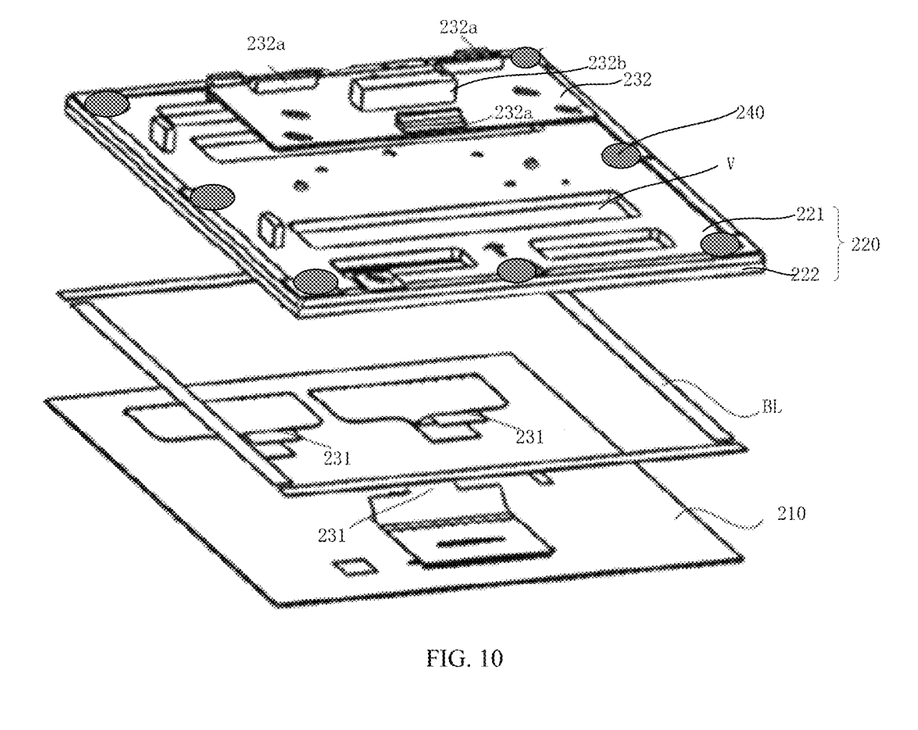
FIG. 10 is a schematic diagram of a display assembly according to some embodiments of the present disclosure.
Figure 11:
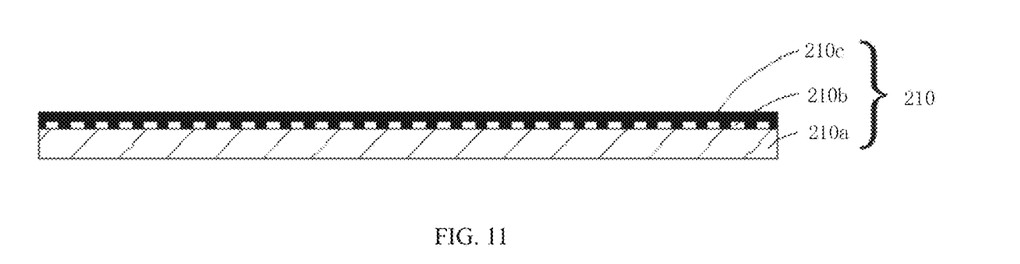
FIG. 11 is a schematic diagram of a display substrate according to some embodiments of the present disclosure.

FIG. 10 is a schematic diagram of a display assembly according to some embodiments of the present disclosure. As shown in FIG. 10, the display assembly 200 includes: a display substrate 210 and a bracket 220. FIG. 11 is a schematic diagram of a display substrate according to some other embodiments of the present disclosure. As shown in FIG. 11, the display substrate 210 includes: a base substrate 210a, and a light-emitting element 210b on the base substrate 210a. The light-emitting element 210b is located on a side of the base substrate 210a away from the box body 110. The base substrate 210a may be a glass substrate, and the light-emitting element 210b may be a small size light-emitting diode or the like. In addition, the display substrate 210 may further include a protective layer 210c on the base substrate 210a. The protective layer 210c is located at least in a region between two adjacent light-emitting elements 210b. In some examples, the protective layer 210c may further cover a surface of the light-emitting element 210b away from the base substrate 210a. The protective layer 210c may be a film layer including carbon black particles, and in this case, the protective layer 210c should have a certain transmittance at a position corresponding to the light-emitting element 210b, to avoid affecting emission of the light-emitting element 210b. By providing the protective layer 210c, the contrast of the display screen of the display substrate 210 can be improved.

As shown in FIG. 10, the bracket 220 is located between the display substrate 210 and the box body. The base substrate 210a of the display substrate 210 is fixedly connected to the bracket 220. One or more display substrates 210 may be fixed to the bracket 220. FIG. 10 illustrates an example where one bracket 220 is configured to fix one display substrate 210. As shown in FIG. 10, the base substrate 210a of the display substrate 210 may be fixed to the bracket 220 by an adhesive member BL. The fixing part 240 is fixed to a side of the bracket 220 facing the box body, so that the bracket 220 is connected to the bearing box 100 by connecting the fixing part 240 to the adjusting member.

In addition, as shown in FIG. 10, the display assembly 200 may further include: a flexible printed circuit 231 and a drive circuit board 232. The bracket 220 may include a bottom plate 221 and a side plate 222 connected to the bottom plate 221. The bottom plate 221 has a bearing surface facing the display substrate 210 and a mounting surface facing away from the display substrate 210. The bearing surface is configured to fix the display substrate 210, and the drive circuit board 232 is disposed on the mounting surface. One end of the drive circuit board 232 is connected to the main control circuit board on the box body 110, and the other end of the drive circuit board 232 is electrically connected to the display substrate 210 through the flexible printed circuit 231. A hollowed-out portion V is provided on the bottom plate 221 of the bracket 220. One part of the flexible printed circuit 231 is electrically connected to the display substrate 210, and the other part of the flexible printed circuit 231 passes through the hollowed-out portion V to be connected to the drive circuit board 232.

The flexible printed circuit 231 electrically connected to the display substrate 210 means that the flexible printed circuit 231 is electrically connected to the light-emitting element 210b. Specifically, the base substrate 210a is provided with a first bonding electrode and a second bonding electrode. The first bonding electrode is located on a side of the base substrate 210a facing away from the light-emitting element, and the second bonding electrode and the light-emitting element 210b are located on the same side of the base substrate 210a. The first bonding electrode is connected to the light-emitting element 210b via a signal line, and the second bonding electrode is connected to the first bonding electrode via a connection line. A bonding area at one end of the flexible printed circuit 231 is connected to the first bonding electrode, and the other end of the flexible printed circuit 231 is connected to a connector 232a on the drive circuit board 232. In some examples, three flexible printed circuits 231 are provided on a non-display side of the display substrate 210, and in one-to-one correspondence with connectors 232a on the drive circuit board 232. A part of the connection line may be located on a side of base substrate 210a, and in this case, when a plurality of display substrates 210 are spliced for display, a splicing seam between adjacent display substrates 210 has a relatively small width.

In some examples, a first connector 132 is provided on the main control circuit board 130, a second connector 232b is provided on the drive circuit board 232, and the first connector is connected to the second connector 232b. The main control circuit board 130 provides control signals for the drive circuit board 232 through the first connector and the second connector 232b, so that the drive circuit board 232 drives the display substrate 210 to display according to the drive signals.

Figure 12:
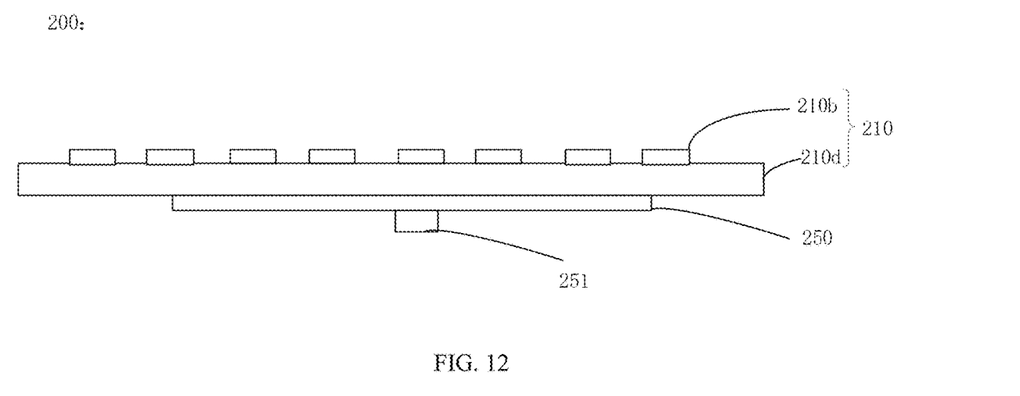
FIG. 12 is a schematic diagram of a display assembly according to some embodiments of the present disclosure.

FIG. 12 is a schematic diagram of a display assembly according to some embodiments of the present disclosure. As shown in FIG. 12, the display assembly 200 includes: a display substrate 210 and a driver chip 250 on the display substrate 210. The display substrate 210 includes: a printed circuit board (PCB) 210d, as well as a light-emitting element 210b on the printed circuit board 210d. The light-emitting element 210b is located on a side of the printed circuit board 210d away from the box, and the light-emitting element 210b may be a small size inorganic light-emitting diode. The fixing part 240 is fixed to a side of the printed circuit board 210d facing the box. In some examples, the fixing part 240 may be fixed to the printed circuit board 210d by a fastener such as an adhesive, a screw, or the like. In other examples, the fixing part 240 may be welded onto the printed circuit board 210d, to improve connection stability of the fixing part 240 and the printed circuit board 210d.

The driver chip 250 is fixed to a side of the printed circuit board 210d facing the box body 110, and connected to the main control circuit board 130 on the box body 110. A first connector (not shown) may be provided on the main control circuit board 130, a third connector 251 may be provided on the driver chip 250, the first connector is connected to the third connector 251, and the main control circuit board 130 provides control signals for the driver chip 250 through the first connector and the third connector 251. The driver chip 250 is configured to control the display substrate to display according to the control signals provided by the main control circuit board 130.

when adopting the structure shown in FIG. 12, the display assembly 200 can be made thin enough, so that the external magnetic operating member 300 can generate a strong attraction force to the adjusting member 120 without separating the display assembly 200 from the bearing box, thereby ensuring synchronous rotation of the adjusting member 120 with the magnetic operating member 300.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A bearing box, comprising:
a box body configured to bear a display assembly, wherein a fixing part is disposed on a side of the display assembly facing the box body;
an adjusting member on the box body, comprising: a magnetic part and an adjusting part connected to the magnetic part, wherein the magnetic part is configured to be connected to the fixing part, and the adjusting part is configured to be movable under an operation of a magnetic operating member, comprising a fixing seat with a fixing slot receiving a first magnetic member, along a thickness direction of the display assembly relative to the box body, to adjust a distance between the fixing part and the box body;
wherein the adjusting part comprises a threaded rod, the box body is provided with a threaded hole matched with the threaded rod, and at least a portion of the threaded rod is disposed into the threaded hole; and
wherein the magnetic part comprises a mount with a mounting slot and a second magnetic member, wherein an orthographic projection of the second magnetic member on the mount is a pattern formed by at least one strip-like part fitted into the mounting slot, the second magnetic member is fixed to the mount, and the mount is connected to the adjusting part; and wherein the first and second magnetic members provide a magnetic force to enable a synchronous rotation of the adjusting member with the magnetic operating member.

2. The bearing box according to claim 1, wherein the mount and the adjusting part form an integral structure.

3. The bearing box according to claim 1, wherein the magnetic member is fixed in the mounting slot.

4. The bearing box according to claim 3, wherein a notch in communication with the mounting slot is provided on an end of the mount facing the display assembly.

5. The bearing box according to claim 1, wherein the magnetic part comprises one magnetic member, and an extension line of an axis of the adjusting part passes through the magnetic member.

6. The bearing box according to claim 1, wherein the magnetic part comprises a plurality of magnetic members uniformly distributed around an extension line of an axis of the adjusting part.

7. The bearing box according to claim 1, wherein
the orthographic projection of the magnetic member on the mount is a pattern formed by at least two strip-like parts intersected with each other.

8. The bearing box according to claim 1, wherein the box body comprises: a bottom wall and a sidewall connected to the bottom wall, wherein the bottom wall and the sidewall define an accommodation space, wherein the bottom wall is further provided with at least one support platform, wherein the support platform has a first surface connected to the bottom wall, a second surface facing the display assembly, and a side surface connected between the first surface and the second surface, wherein the support platform is located in the accommodation space, and the threaded hole is provided in the second surface of the support platform.

9. The bearing box according to claim 1, wherein the box body has one or more bearing regions, each of bearing regions corresponds to one display assembly, and the bearing region is provided with the adjusting member at each corner position.

10. A splicing display apparatus, comprising: a display assembly and a bearing box bearing the display assembly, wherein the bearing box is the bearing box according to claim 1.

11. The splicing display apparatus according to claim 10, wherein the adjusting part comprises a threaded rod, the box body is provided with a threaded hole matched with the threaded rod, and at least a portion of the threaded rod is disposed into the threaded hole, and
the fixing part is made of a material comprising a ferromagnetic material.

12. The splicing display apparatus according to claim 11, wherein the fixing part comprises an iron block and an anti-oxidation layer covering at least partially a surface of the iron block.

13. The splicing display apparatus according to claim 10, wherein the display assembly comprises: a display substrate comprising: a printed circuit board and a light-emitting element on the printed circuit board, the light-emitting element is located on a side of the printed circuit board away from the bearing box, and the fixing part is fixed to a side of the printed circuit board facing the bearing box.

14. The splicing display apparatus according to claim 10, wherein the display assembly comprises:
a display substrate comprising: a base substrate and a light-emitting element on the base substrate, the light-emitting element being located on a side of the base substrate away from the bearing box; and
a bracket between the display substrate and the bearing box;
wherein the base substrate is fixedly connected to the bracket, and the fixing part is fixed to a side of the bracket facing the bearing box.

* * * * *